United States Patent
Chu

(10) Patent No.: US 11,978,624 B2
(45) Date of Patent: May 7, 2024

(54) SEMICONDUCTOR STRUCTURE AND ITS FORMATION METHOD

(71) Applicant: CHANGXIN MEMORY TECHNOLOGIES, INC., Hefei (CN)

(72) Inventor: Jiang Chu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 127 days.

(21) Appl. No.: 17/455,724

(22) Filed: Nov. 19, 2021

(65) Prior Publication Data

US 2022/0084818 A1    Mar. 17, 2022

Related U.S. Application Data

(63) Continuation of application No. PCT/CN2021/097399, filed on May 31, 2021.

(30) Foreign Application Priority Data

Jul. 16, 2020    (CN) .......................... 202010687169.4

(51) Int. Cl.
*H01L 21/02* (2006.01)
*H01L 21/768* (2006.01)
*H01L 23/532* (2006.01)

(52) U.S. Cl.
CPC .. *H01L 21/02216* (2013.01); *H01L 21/02145* (2013.01); *H01L 21/02148* (2013.01); *H01L 21/02156* (2013.01); *H01L 21/02159* (2013.01); *H01L 21/02164* (2013.01); *H01L 21/7682* (2013.01); *H01L 21/76898* (2013.01); *H01L 23/53295* (2013.01)

(58) Field of Classification Search
CPC ......... H01L 21/02216; H01L 21/02145; H01L 21/02148; H01L 21/02156;
(Continued)

(56) References Cited

U.S. PATENT DOCUMENTS

2003/0032306 A1    2/2003    Conti et al.
2011/0021036 A1    1/2011    Braecklmann et al.
(Continued)

FOREIGN PATENT DOCUMENTS

CN    106033741 A    10/2016
CN    106935544 A    7/2017
(Continued)

OTHER PUBLICATIONS

Written Opinion of the International Search Authority in the corresponding international application No. PCT/CN2021/097399, dated Aug. 27, 2021.
(Continued)

*Primary Examiner* — Cuong B Nguyen
(74) *Attorney, Agent, or Firm* — Cooper Legal Group, LLC

(57) ABSTRACT

Embodiments of the present application provide a semiconductor structure and its formation method. The method includes: the substrate being provided with a groove, a sidewall of the groove including a first sub-sidewall and a second sub-sidewall that extend upwards from a bottom of the groove sub-sidewall; blowing a first precursor to a surface of the substrate, so that the first precursor is attached to a top surface of the substrate and the second sub-sidewall; blowing a second precursor to the surface of the substrate, so that the second precursor reacts with the first precursor to form a dielectric layer; alternately blowing the first precursor and the second precursor to the surface of the substrate to form a plurality of dielectric layers until a top opening of the groove is blocked, a region enclosed by the first sub-sidewall, the dielectric layer and the bottom of the groove forming a void.

13 Claims, 6 Drawing Sheets

(58) Field of Classification Search
CPC ......... H01L 21/02159; H01L 21/02164; H01L 21/7682; H01L 21/76898; H01L 23/53295; H01L 21/02178; H01L 21/02271; H01L 21/48; H01L 21/76801; H01L 23/498; H01L 21/4803; H01L 21/481; H01L 23/49838

See application file for complete search history.

(56) References Cited

U.S. PATENT DOCUMENTS

| | | | |
|---|---|---|---|
| 2013/0175665 A1* | 7/2013 | Chudzik | ................ H01L 21/84 257/532 |
| 2016/0086966 A1 | 3/2016 | Jhang et al. | |
| 2016/0276260 A1 | 9/2016 | Liou et al. | |

FOREIGN PATENT DOCUMENTS

| | | |
|---|---|---|
| CN | 108807339 A | 11/2018 |
| CN | 109478534 A | 3/2019 |
| TW | I234204 B | 6/2005 |

OTHER PUBLICATIONS

International Search Report as cited in PCT Application No. PCT/CN2021/097399 dated Aug. 27, 2021, 9 pages.

* cited by examiner

SEMICONDUCTOR STRUCTURE AND ITS FORMATION METHOD

CROSS-REFERENCE TO RELATED APPLICATIONS

This application is a continuation application of International Patent Application No. PCT/CN2021/097399, filed on May 31, 2021, which claims priority to Chinese Patent Application No. 202010687169.4, filed with the Chinese Patent Office on Jul. 16, 2020 and entitled "SEMICONDUCTOR STRUCTURE AND ITS FORMATION METHOD." International Patent Application No. PCT/CN2021/097399 and Chinese Patent Application No. 202010687169.4 are incorporated herein by reference in their entireties.

TECHNICAL FIELD

Embodiments of the present application relate to the field of semiconductors, and in particular, to a semiconductor structure and its formation method.

BACKGROUND

With continuous progress of a semiconductor technology, resistance-capacitance delay (RC delay) that affects a transmission speed of a circuit is gradually highlighted. Parasitic resistance R can be reduced currently by adjusting a connecting material of a conductor. However, due to technical limitations, parasitic capacitance C cannot be reduced by changing a connection geometry of the conductor.

Since the parasitic capacitance C is directly proportional to a dielectric constant k of an insulating dielectric in the circuit, if a low-k material is used as an insulating dielectric layer, a parasitic effect in the circuit may be greatly reduced, thereby improving a signal transmission speed. A dielectric constant of air is close to 1. If the air is introduced into a dielectric layer, a dielectric constant k of the dielectric layer can be greatly reduced.

SUMMARY

Some embodiments of the present application provide a semiconductor structure and its formation method, which can introduce an air void into a dielectric layer to reduce a dielectric constant k of the dielectric layer.

In order to solve the above problem, some embodiments of the present application provide a semiconductor structure formation method, including: providing a substrate, the substrate being provided with a groove, a sidewall of the groove including a first sub-sidewall and a second sub-sidewall that extend upwards from a bottom of the groove, the first sub-sidewall being located between the second sub-sidewall and the bottom of the groove; blowing a first precursor to a surface of the substrate at a flow rate less than a preset value, so that the first precursor is attached to a top surface of the substrate and the second sub-sidewall; blowing a second precursor to the surface of the substrate, so that the second precursor reacts with the first precursor to form a dielectric layer; and alternately blowing the first precursor and the second precursor to the surface of the substrate to form a plurality of dielectric layers until a top opening of the groove is blocked, a region enclosed by the first sub-sidewall, the dielectric layer and the bottom of the groove forming a void.

Some embodiments of the present application further provide a semiconductor structure, including: a substrate and a groove located in the substrate, a sidewall of the groove including a first sub-sidewall and a second sub-sidewall that extend upwards from a bottom of the groove, the first sub-sidewall being located between the second sub-sidewall and the bottom of the groove; a plurality of dielectric layers, the plurality of dielectric layers blocking a top opening of the groove and being sequentially stacked in a direction of the sidewall of the groove toward a central axis of the groove; and a void, the void being formed by a region enclosed by the first sub-sidewall, the bottom of the groove and the plurality of dielectric layers.

BRIEF DESCRIPTION OF DRAWINGS

One or more embodiments are exemplarily described by using figures that are corresponding thereto in the accompanying drawings; the exemplary descriptions do not constitute limitations on the embodiments. Unless otherwise particularly stated, the figures in the accompanying drawings do not constitute a scale limitation.

DESCRIPTION OF EMBODIMENTS

To make the objectives, technical solutions and advantages of the embodiments of the present application clearer, various embodiments of the present application are elaborated in detail below with reference to the accompanying drawings. However, those of ordinary skill in the art may understand that, in the embodiments of the present application, numerous technical details are set forth in order to provide a reader with a better understanding of the present application. However, the technical solutions claimed in the present application can be implemented without these technical details and various changes and modifications based on the embodiments below.

FIG. 1, FIG. 2, FIG. 4 and FIG. 11 to FIG. 13 are schematic structural diagrams corresponding to steps of a semiconductor structure formation method according to an embodiment of the present application, and FIG. 3 and FIG. 5 to FIG. 10 are schematic structural diagrams of chemical reactions corresponding to the semiconductor structure formation method according to an embodiment of the present application.

Figure 1:
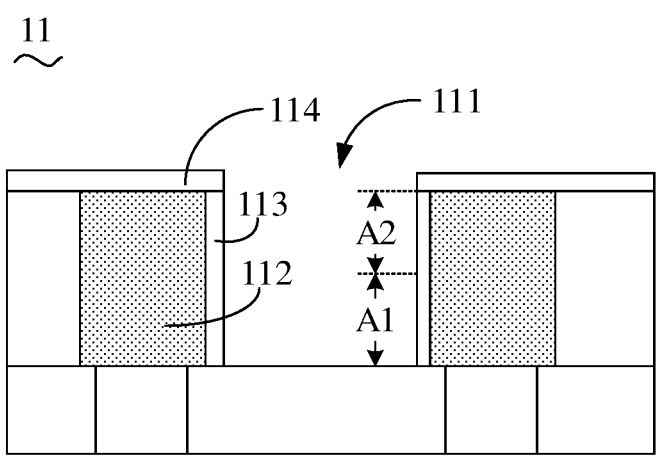
FIG. 1, FIG. 2, FIG. 4 and FIG. 11 to FIG. 13 are schematic structural diagrams corresponding to steps of a semiconductor structure formation method according to an embodiment of the present application.

Referring to FIG. 1, a substrate 11 is provided. The substrate 11 is provided with a groove 111, a sidewall of the groove 111 includes a first sub-sidewall A1 and a second sub-sidewall A2 that extend upwards from a bottom of the groove 111, and the first sub-sidewall A1 is located between the second sub-sidewall A2 and the bottom of the groove 111.

In this embodiment, the substrate 11 is provided with a conductive structure 112 located on two opposite sides of the groove 111. The conductive structure 112 may be a component such as a conductor or a conductive plug. When the conductive structure 112 is powered on, parasitic capacitance may be formed between adjacent conductive structures 112. Magnitude of the parasitic capacitance depends on a dielectric constant k of a dielectric material between the adjacent conductive structures 112. The smaller the dielectric constant k, the smaller the parasitic capacitance.

In this embodiment, the substrate 11 further includes a passivation layer 113 located on a sidewall of the conductive structure 112 and an isolation layer 114 located on a top surface of the conductive structure 112. The passivation layer 113 is usually an allowance when the groove 111 is formed by etching, so as to avoid damages of an etching agent to the conductive structure 112. A region surrounded by the passivation layer 113 forms the groove 111. The isolation layer 114 mainly functions as an etch stop layer to avoid damages to the conductive structure 112 caused by penetration of the etching agent through the isolation layer 114. The passivation layer 113 and the isolation layer 114 may be made of a same material or different materials.

It is to be noted that, features such as formation methods, materials and positions of the passivation layer 113 and the isolation layer 114 are not limited herein. In fact, in other embodiments, no passivation layer and no isolation layer are provided; that is, the top surface and at least part of a sidewall surface of the conductive structure are exposed.

In this embodiment, a region surrounded by the second sub-sidewall A2 is configured to be filled with dielectric layers formed subsequently, so as to achieve a purpose of blocking a top opening of the groove 111. A region surrounded by the first sub-sidewall A1 is configured to form a void, so as to achieve a purpose of reducing the dielectric constant k of the dielectric layer between the adjacent conductive structures 112.

In this embodiment, in a direction perpendicular to the surface of the substrate 11, a ratio of a height of the first sub-sidewall A1 to a height of the second sub-sidewall A2 ranges from 1 to 9, for example, 3, 5 or 7. The thickness ratio is determined before an operator blows a first precursor. The thickness ratio should not only ensure a relatively low dielectric constant k of the dielectric layer between adjacent conductive structures 112 but also take process feasibility and structural stability into account.

The process feasibility means that the first precursor cannot be ensured to be coated only on a top surface of the substrate 11 in a process of blowing the first precursor; that is, the first precursor may be attached to some sidewalls of the groove 111. Therefore, a minimum attachment depth of the first precursor should be taken into account during setting of the thickness ratio, so as to set a reasonable and effective thickness ratio. In addition, the structural stability refers to bearing capacity of the dielectric layer; due to possible subsequent formation of other film layers or structures on the substrate 11, to avoid collapse of the dielectric layer caused by inability to bear the pressure which affects the dielectric constant k of the dielectric layer between the adjacent conductive structures 112, the dielectric layer should have a certain thickness in a direction of extending upwards from the bottom of the groove 111, so as to meet a preset bearing capacity requirement.

It is to be noted that, the technical solution provided herein is generally applied to the groove 111 with an aspect ratio greater than 1. When the aspect ratio of the groove 111 is less than 1, the blown precursor is prone to contact with the bottom of the groove 111, resulting in inability to form an ideal void.

Figure 2:
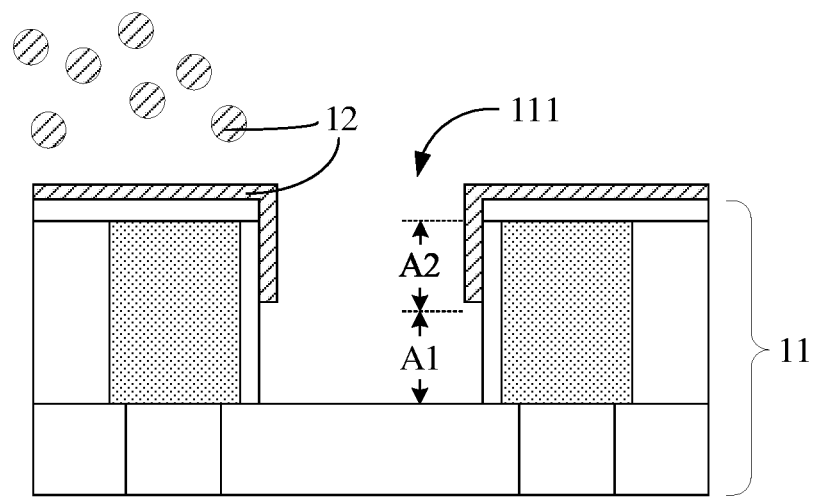

Referring to FIG. 2, a first precursor 12 is blown to the surface of the substrate 11 at a flow rate less than a preset value, so that the first precursor 12 is attached to a top surface of the substrate 11 and the second sub-sidewall A2.

The preset value is an ideal value. When the first precursor 12 is blown to the surface of the substrate 11 at a flow rate greater than or equal to the preset value, the first precursor 12 can cover the top surface of the substrate 11, the second sub-sidewall A2, the first sub-sidewall A1 and a bottom surface of the groove 111. During the blowing, the first precursor 12 sequentially contacts the top surface of the substrate 11, the second sub-sidewall A2, the first sub-sidewall A1 and the bottom surface of the groove 111.

When the first precursor 12 is blown to the surface of the substrate 11 at a flow rate less than the preset value, due to an insufficient amount of substances of the first precursor 12 per unit time, the first precursor 12 may be preferentially attached to the surface of the substrate 11 previously contacted, that is, the top surface of the substrate 11 and the second sub-sidewall A2.

Figure 3:
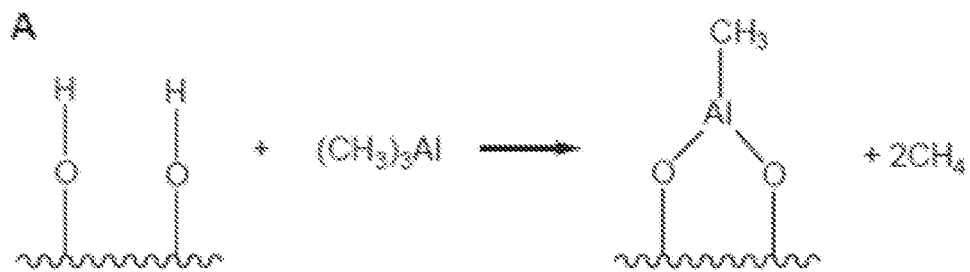
FIG. 3 and FIG. 5 to FIG. 10 are schematic structural diagrams of chemical reactions corresponding to the semiconductor structure formation method according to an embodiment of the present application.

Referring to FIG. 3, the first precursor 12 (see FIG. 2) produces a first reaction A on the surface of substrate 11 (see FIG. 2).

In this embodiment, the first precursor 12 includes a metal organic compound with a catalytic function, which is specifically trimethylaluminium $(CH_3)_3Al$. The catalytic function of the first precursor 12 is mainly configured to accelerate a reaction of the first precursor 12 with a subsequently blown second precursor to form a dielectric layer material.

A metallic material in the metal organic compound includes at least one of aluminum, lanthanum, zirconium and hafnium.

In this embodiment, the substrate 11 has a polar group on the surface, and in the process step of blowing the first precursor 12, the polar group reacts with the first precursor 12 to fix a functional group of the first precursor 12. For example, the substrate 11 includes hydroxy-OH on the surface. In a process of blowing trimethylaluminium, methyl-$CH_3$ in trimethylaluminium reacts with hydrogen atom-H in the hydroxyl group to form alkane $CH_4$. The remaining —$CH_3Al$ acts as a functional group and binds to oxygen ions in the original hydroxyl group to provide a catalytic function for a subsequent dielectric-layer reaction.

Since the substrate 11 has a polar group the surface which can react with the first precursor 12, in a blowing direction of the first precursor 12, the first precursor 12 may be attached to a top surface of the substrate 11 and the second sub-sidewall A2 that are previously contacted, so as to avoid attachment of the first precursor 12 to the first sub-sidewall A1 or the bottom of the groove 111 and ensure that a region surrounded by the first sub-sidewall A1 has a relatively low dielectric constant.

In this embodiment, the polar group on the surface of the substrate 11 is naturally formed due to exposure of the substrate 11 to air or water vapor. In other embodiments, the polar group may also be formed through certain process steps. In addition, the polar group is not limited to the hydroxyl group, and may also be any polar group that can react with the first precursor 12 and fix its functional group. Further, the substance attached to the surface of the substrate may not be the polar group, but any chemical substance that can react with the first precursor 12 and retain its functional group.

In this embodiment, the first precursor 12 is in a gaseous state. In other embodiments, the first precursor may also be in a liquid state. Compared with the gaseous state, viscosity of fluid movement is more obvious in the liquid state due to small intermolecular spacing. Therefore, the first precursor in the liquid state is more likely to be attached to the surface of the substrate after contacting the surface of the substrate, which is conducive to ensuring that the first precursor is attached only to the top surface of the substrate and the second sub-sidewall, so that the region enclosed by the first sub-sidewall has a relatively low dielectric constant k.

Figure 4:
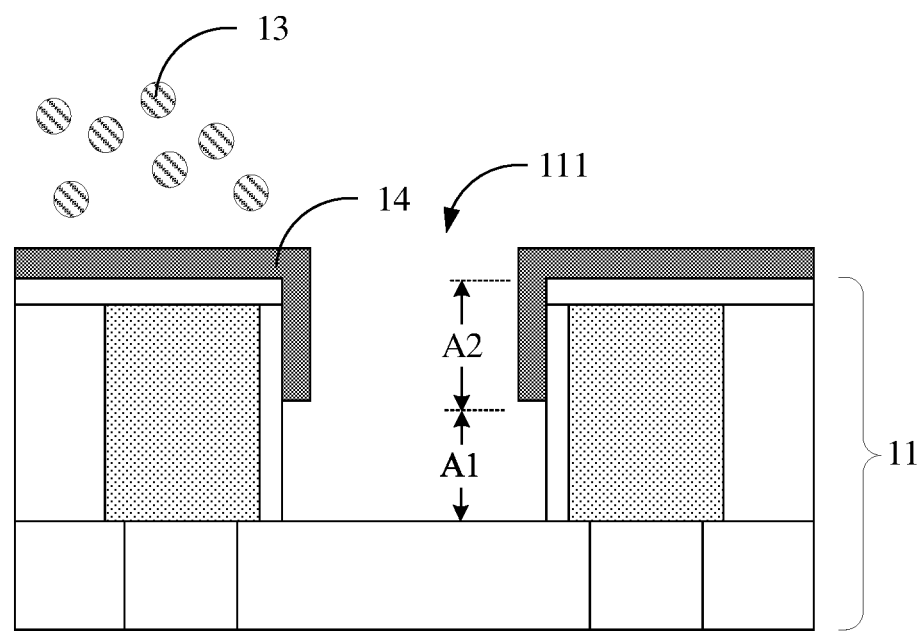
Figure 5:
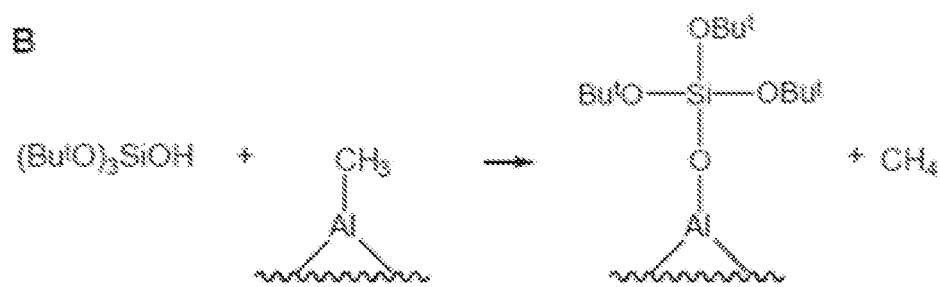
Figure 6:
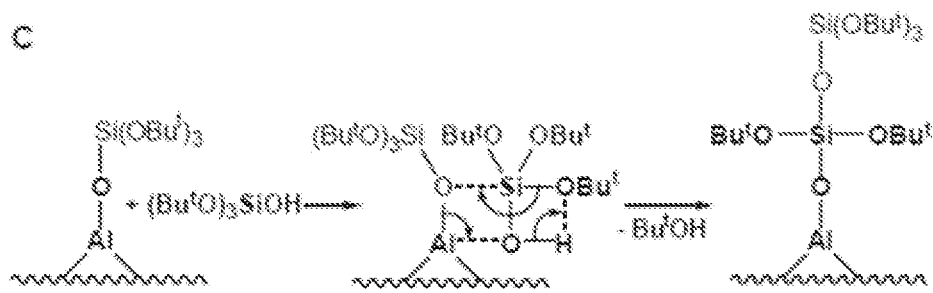
Figure 7:
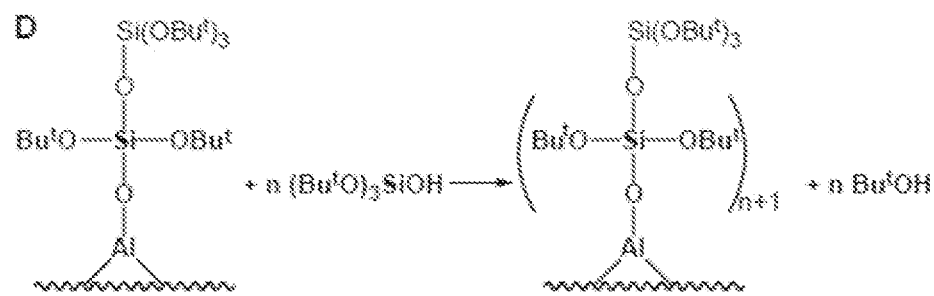
Figure 8:
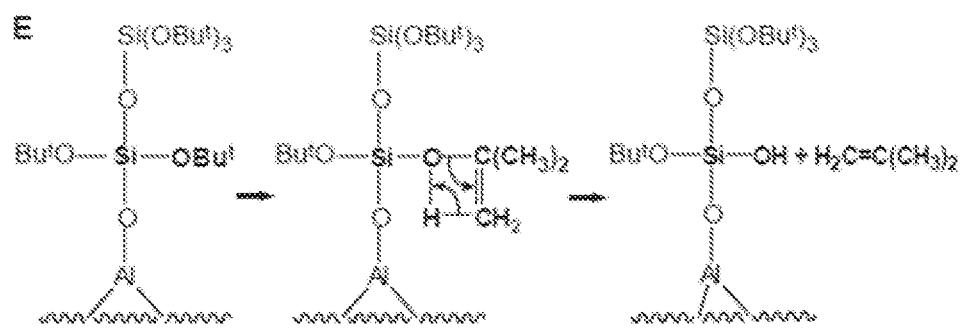
Figure 9:
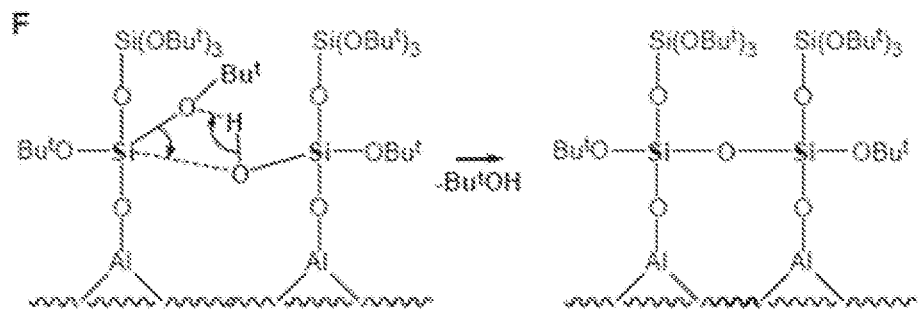
Figure 10:
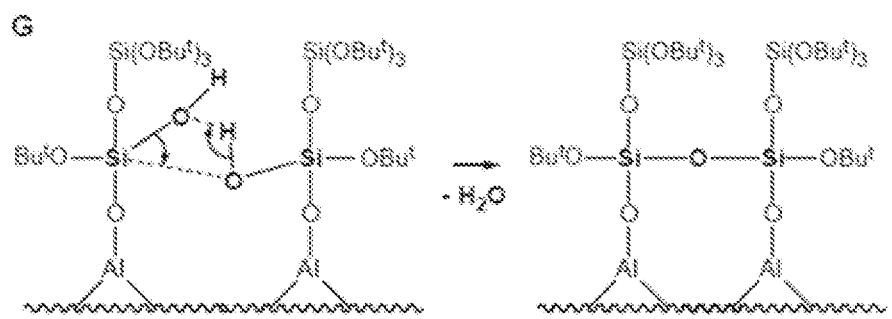

Referring to FIG. 4, a second precursor 13 is blown to the surface of the substrate 11, so that the second precursor 13 reacts with the first precursor 12 (see FIG. 2) to form a dielectric layer 14.

In this embodiment, the dielectric layer 14 is made of silicon dioxide, and a silicon source of silicon dioxide includes a silanol group; that is, at least one of the first precursor 12 and the second precursor 13 includes an organic compound containing a silanol group. Silicon dioxide has a relatively low dielectric constant k. The selection of silicon dioxide as the material of the dielectric layer 14 is conducive to ensuring that the region enclosed by the second sub-sidewall A2 (the region is filled with the dielectric layer 14) has a relatively low dielectric constant k.

In this embodiment, the second precursor 13 is made of tris(tert-butoxy)silanol. Tris(tert-butoxy)silanol may selectively bind to a metal organic compound. The use of the metal organic compound as the first precursor 12 and the use of tris(tert-butoxy)silanol as the second precursor 13 can ensure that the second precursor 13 binds only to the first precursor 12 effectively; that is, the dielectric layer 14 is formed only at an attachment position of the first precursor 12, which avoids attachment of the second precursor 13 to the first sub-sidewall A1 or the bottom surface of the groove 111, so that the region enclosed by the first sub-sidewall A1 has a relatively low dielectric constant k.

Referring to FIG. 5 to FIG. 10, the first precursor 12 (see FIG. 2) reacts with the second precursor 13 (see FIG. 4) to form the dielectric layer 14 (see FIG. 4). A reaction process mainly includes a second reaction B, a third reaction C, a fourth reaction D, a fifth reaction E, a sixth reaction F and a seventh reaction G.

The second reaction B and the third reaction C are reactions of tris(tert-butoxy)silanol as chain macromolecules with a substance on the surface of the substrate 11. The substance on the surface of the substrate 11 may change as the reaction proceeds. The fourth reaction D is a polymerization reaction, the fifth reaction E and the sixth reaction F form two parallel intermediate compounds, and the seventh reaction G forms a final product, silicon dioxide.

In the present application, a silicon dioxide film layer is formed through a reaction between chain macromolecules, which greatly improves film-forming efficiency of silicon dioxide. The film-forming efficiency of silicon dioxide in the present application is 50 to 100 times the film-forming efficiency of silicon dioxide in an ordinary atomic layer deposition process.

In this embodiment, a reaction temperature at which the first precursor 12 and the second precursor 13 react to form the dielectric layer 14 ranges from 225° C. to 250° C., for example, 230° C., 237° C. or 245° C. At the reaction temperature, the first precursor 12 and the second precursor 13 have a higher reaction rate, which is conducive to shortening the process cycle.

In this embodiment, after the formation of the dielectric layer 14, excess first precursor 12, second precursor 13 and various intermediates formed by the reaction are removed by a cleaning process. This avoids the influence of excess unreacted precursors and reaction intermediates on formation of subsequent dielectric layers 14 and on property parameters of a plurality of eventually formed dielectric layers 14. The property parameters include a dielectric constant k and bearing capacity.

In this embodiment, from the beginning of the blowing of the first precursor 12 to the formation of the dielectric layer 14, the reaction temperature in the whole technological process ranges from 225° C. to 250° C. This is conducive to improving the reaction rate of the chemical reactions in the technological process and to enabling precursors and intermediates to volatilize into or remain in the gaseous state, so as to avoid the deposition of precursors and intermediates in the liquid state on the surface of the substrate 11, which may affect the chemical reactions. In addition, the precursors and intermediates in the gaseous state can be effectively removed by introduction of an inert gas.

The reaction temperature in the technological process can be adjusted according to materials actually involved in the reaction and the intermediates formed by the reaction to achieve a preset purpose.

Figure 11:
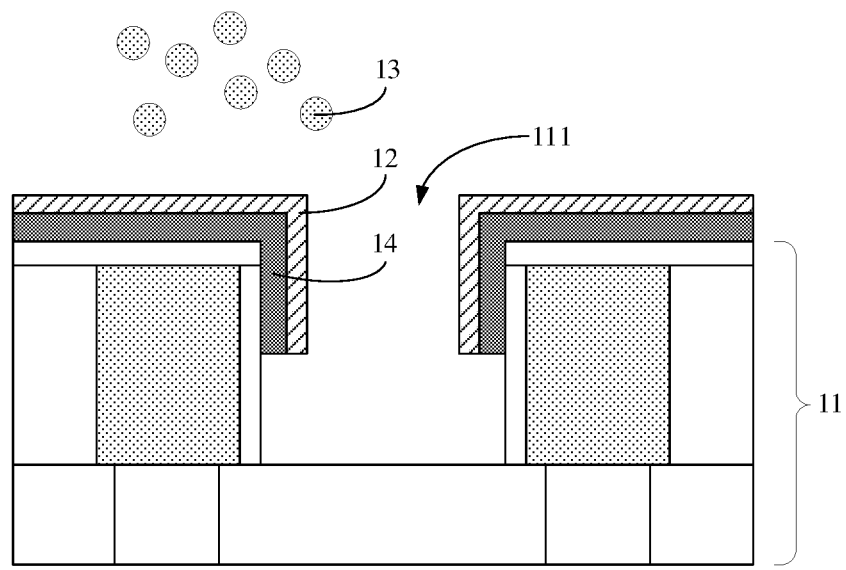
Figure 12:
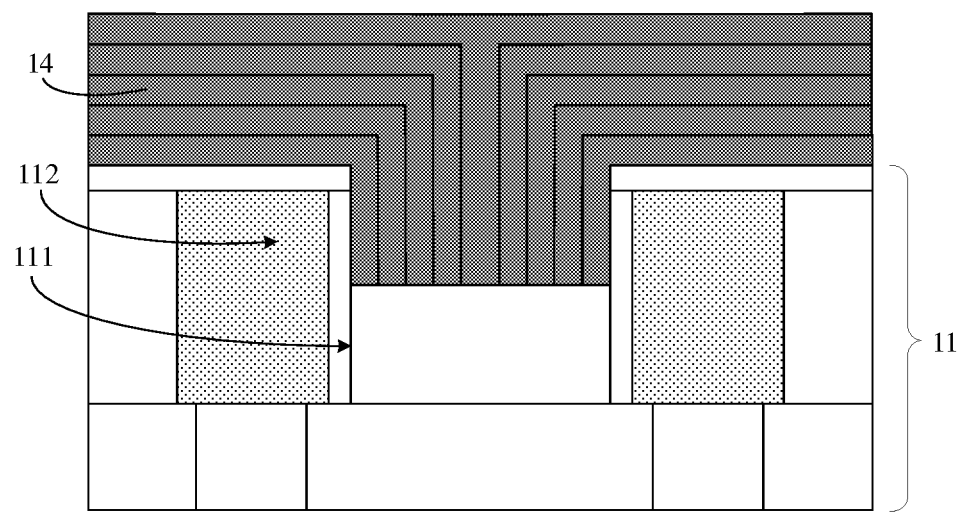

Referring to FIG. 11 and FIG. 12, the first precursor 12 and the second precursor 13 are alternately blown to the surface of the substrate 11 to form a plurality of dielectric layers 14 until a top opening of the groove 111 is blocked, and a region enclosed the first sub-sidewall A1 (see FIG. 4), the bottom of the groove 111 and the dielectric layer 14 form a void.

In this embodiment, the dielectric layer 14 has a polar group on the surface, and in the process step of blowing the first precursor 12, the polar group reacts with the first precursor 12 to fix a functional group of the first precursor 12. Since the dielectric layer 14 has a polar group on the surface which can fix the first precursor 12, when the first precursor 12 is alternately blown, the first precursor 12 may be attached to the surface previously contacted, that is, the top surface and the sidewall surface of the dielectric layer 14, thereby avoiding attachment of the first precursor 12 to the first sub-sidewall A1 or the bottom of the groove 111.

Correspondingly, the polar group on the surface of the dielectric layer 14 may be either naturally produced by exposure to an environment such as air or water vapor or formed by processing. In addition, the dielectric layer 14 may also contain substances other than the polar group on the surface to fix the functional group of the first precursor 12.

In this embodiment, in a process of forming the plurality of dielectric layers 14, the first precursor 12 is blown at a gradually increasing flow rate layer by layer. In the process of forming the plurality of dielectric layers 14 with a same thickness, a surface area of the dielectric layer 14 gradually increases. Therefore, the first precursor 12 is required to be blown at a gradually increasing flow rate, so that the first precursor 12 can be attached to the sidewall of the dielectric layer 14, thereby blocking the top opening of the groove 111.

In this embodiment, the dielectric layer 14 formed later covers an entire sidewall surface of the dielectric layer 14 formed previously, so that the region enclosed by the second sub-sidewall A2 is filled with the plurality of eventually formed dielectric layers 14. This structure has higher structural stability. When subjected to a force from the conductive structure toward the groove 111, the plurality of dielectric layers 14 may not rupture due to stress concentration.

Figure 13:
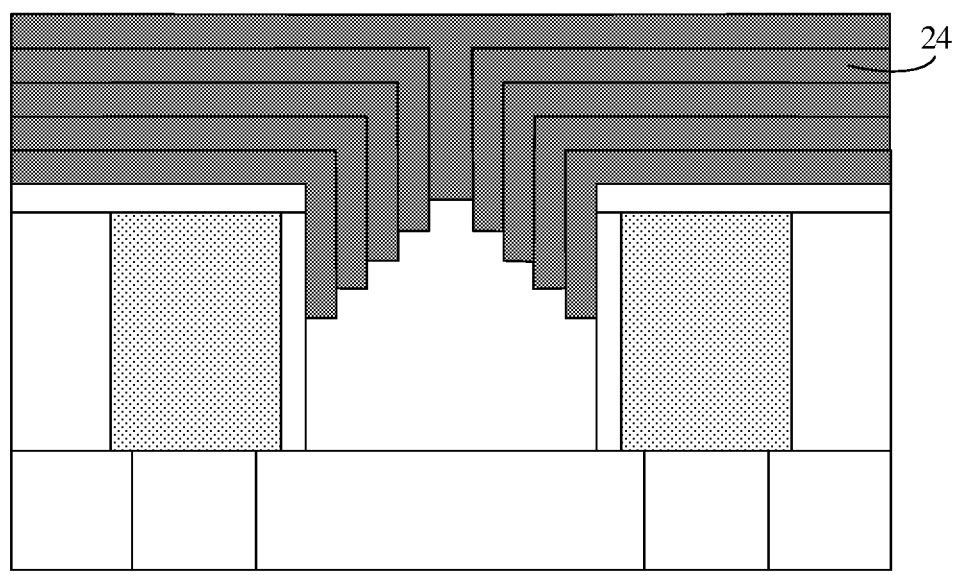

In other embodiments, referring to FIG. 13, a dielectric layer 24 formed later covers part of a sidewall surface of a dielectric layer 24 formed previously, so that the first precursor can be blown according to a same flow-rate parameter in a process of forming the dielectric layers 24 layer by layer, which is conducive to reducing process difficulty.

In this embodiment, the first precursor is blown at a flow rate less than a preset value, so that the first precursor is attached only to the top surface of the substrate and the second sub-sidewall. In this way, when the plurality of dielectric layers blocking the top opening of the groove are formed, the region enclosed by the first sub-sidewall, the bottom of the groove and the plurality of dielectric layers can form a void.

Correspondingly, an embodiment of the present application further provides a semiconductor structure that may be fabricated with the semiconductor structure formation method described above.

Referring to FIG. 12, the semiconductor structure includes: a substrate 11 and a groove 111 located in the substrate 11, the groove 111 including a first sub-sidewall and a second sub-sidewall that extend upwards from a bottom of the groove 111, the first sub-sidewall being located between the second sub-sidewall and the bottom of the groove 111; a plurality of dielectric layers 14, the plurality of dielectric layers 14 blocking a top opening of the groove 111 and being sequentially stacked in a direction of the sidewall of the groove 111 toward a central axis of the groove 111; and a void, the void being formed by a region enclosed by the first sub-sidewall, the bottom of the groove 111 and the plurality of dielectric layers 14.

In this embodiment, the substrate 11 is provided with a conductive structure 112 located on two opposite sides of the groove 111.

In this embodiment, the plurality of dielectric layers 14 contain a metallic material, and the metallic material includes at least one of aluminum, lanthanum, zirconium and hafnium. The metallic material may not affect a dielectric function of the dielectric layer 14

In this embodiment, a new semiconductor structure is provided. The semiconductor structure includes a plurality of dielectric layers blocking a top opening of a groove and a void defined by a first sub-sidewall, a bottom of the groove and the plurality of dielectric layers. When the void is introduced into the dielectric layer, the dielectric layer has a relatively low dielectric constant k.

Those of ordinary skill in the art may understand that the above implementations are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A semiconductor structure formation method, comprising:
providing a substrate, the substrate being provided with a groove, a sidewall of the groove comprising a first sub-sidewall and a second sub-sidewall that extend upwards from a bottom of the groove, the first sub-sidewall being located between the second sub-sidewall and the bottom of the groove;
blowing a first precursor to a surface of the substrate at a flow rate less than a preset value, so that the first precursor is attached both to a top surface of the substrate and the second sub-sidewall;
blowing a second precursor to the surface of the substrate, so that the second precursor reacts with the first precursor to form a dielectric layer; and
alternately blowing the first precursor and the second precursor to the surface of the substrate to form a plurality of dielectric layers until a top opening of the groove is blocked, a region enclosed by the first sub-sidewall, the plurality of dielectric layers and the bottom of the groove forming a void.

2. The semiconductor structure formation method according to claim 1, wherein in a process of forming the plurality of dielectric layers, the first precursor is blown at a gradually increasing flow rate layer by layer.

3. The semiconductor structure formation method according to claim 1, wherein the substrate has a polar group on the surface; and in the process step of blowing the first precursor, the polar group reacts with the first precursor to fix a functional group of the first precursor.

4. The semiconductor structure formation method according to claim 1, wherein the dielectric layer has a polar group on a surface; and in the process step of blowing the first precursor, the polar group reacts with the first precursor to fix a functional group of the first precursor.

5. The semiconductor structure formation method according to claim 3, wherein the polar group comprises a hydroxy group.

6. The semiconductor structure formation method according to claim 1, wherein the dielectric layer is made of silicon dioxide, and at least one of the first precursor or the second precursor comprises an organic compound containing a silanol group.

7. The semiconductor structure formation method according to claim 6, wherein the organic compound containing the silanol group comprises tris(tert-butoxy)silanol.

8. The semiconductor structure formation method according to claim 1, wherein the first precursor comprises a metal organic compound with a catalytic function.

9. The semiconductor structure formation method according to claim 8, wherein a metallic material in the metal organic compound comprises at least one of aluminum, lanthanum, zirconium or hafnium.

10. The semiconductor structure formation method according to claim 1, wherein a reaction temperature at which the first precursor and the second precursor react to form the dielectric layer ranges from 225° C. to 250° C.

11. The semiconductor structure formation method according to claim 1, wherein in a direction perpendicular to the surface of the substrate, a ratio of a height of the first sub-sidewall to a height of the second sub-sidewall ranges from 1 to 9.

12. The semiconductor structure formation method according to claim 4, wherein the polar group comprises a hydroxy group.

13. The semiconductor structure formation method according to claim 7, wherein the first precursor comprises a metal organic compound with a catalytic function.

* * * * *